(12) United States Patent
Kuo et al.

(10) Patent No.: US 7,102,222 B2
(45) Date of Patent: Sep. 5, 2006

(54) CONDUCTIVE TRACE STRUCTURE AND SEMICONDUCTOR PACKAGE HAVING THE CONDUCTIVE TRACE STRUCTURE

(75) Inventors: Kuan-Ting Kuo, Taichung Hsien (TW); Yu-Ting Lai, Taichung Hsien (TW); Chin-Chien Chiang, Taichung Hsien (TW)

(73) Assignee: Siliconware Precision Industries Co., Ltd., (TW)

( * ) Notice: Subject to any disclaimer, the term of this patent is extended or adjusted under 35 U.S.C. 154(b) by 288 days.

(21) Appl. No.: 10/846,427

(22) Filed: May 14, 2004

(65) Prior Publication Data

US 2005/0073038 A1    Apr. 7, 2005

(30) Foreign Application Priority Data

Oct. 2, 2003    (TW) ............................... 92127259 A

(51) Int. Cl.
*H01L 23/48* (2006.01)
(52) U.S. Cl. ...................................... 257/690; 257/701
(58) Field of Classification Search ................ 257/690, 257/692, 700, 701, 773
See application file for complete search history.

(56) References Cited

U.S. PATENT DOCUMENTS 5,399,903 A * 3/1995 Rostoker et al. ............ 257/666
5,903,051 A * 5/1999 Miks et al. .................. 257/700
6,268,568 B1 * 7/2001 Kim ............................ 174/250

* cited by examiner

Primary Examiner—Roy Potter
(74) Attorney, Agent, or Firm—Peter F. Corless; Steven M. Jensen; Edwards Angell Palmer & Dodge LLP

(57) ABSTRACT

A conductive trace structure and a semiconductor package having the conductive trace structure are provided. A plurality of conductive traces are formed in and surrounding a chip mounting area on a substrate, for mounting a chip on the chip mounting area. Widened portions are formed on the conductive traces in the chip mounting area and at positions across a periphery of the chip mounting area, the widened portions having a line width larger than that of the rest part of the conductive traces. The widened portions of the conductive traces can sustain concentrated thermal stress from the peripheral area of the chip caused by mismatch in coefficient of thermal expansion between the chip and the substrate. This prevents the conductive traces that pass through the periphery of the chip mounting area from cracks or breaks due to the thermal stress, thereby improving the reliability and yield of the semiconductor package.

14 Claims, 3 Drawing Sheets

//  CONDUCTIVE TRACE STRUCTURE AND SEMICONDUCTOR PACKAGE HAVING THE CONDUCTIVE TRACE STRUCTURE

FIELD OF THE INVENTION

The present invention relates to conductive trace structures and semiconductor packages having the conductive trace structures, and more particularly, to a conductive trace fabrication technology for use in a ball grid array (BGA) semiconductor package to enhance the reliability of the semiconductor package by modifying a part of the conductive trace structure.

BACKGROUND OF THE INVENTION

Ball grid array (BGA) packaging technology is an advanced semiconductor packaging technology, which is characterized in that a semiconductor chip is mounted on a front surface of a substrate, and a plurality of conductive elements such as solder balls are arranged in a matrix array, customarily referred to as ball grid array, on a back surface of the substrate. The ball grid array allows the semiconductor package to be bonded and electrically connected to an external printed circuit board (PCB) or other electronic devices.

A typical plastic ball grid array (PBGA) semiconductor package, as disclosed in U.S. Pat. Nos. 5,640,048, 5,650,660, 5,739,588 and 5,801,440, is shown with its cross-sectional view in FIG. 1. This PBGA package comprises (a) a substrate 100, (b) a semiconductor chip 120, (c) a plurality of bonding wires 130, (d) an encapsulation body 140, and (e) a ball grid array 150 comprising a plurality of array-arranged solder balls 15.

In the PBGA package, the substrate 100 comprises an insulating dielectric layer 110 such as a resin core. The dielectric layer 110 has a front surface 111 and a back surface 112, wherein the front surface 111 is formed with a chip mounting area 108 for accommodating the chip 120, and the chip mounting area 108 is made of a conductive material to serve as a ground paddle. A plurality of conductive traces 101 are formed on the front surface 111 and the back surface 112 of the dielectric layer 110, wherein the conductive traces 101 on the front surface 111 are located around the chip mounting area 108 and covered by an insulating solder mask layer 102. Terminals of the conductive trace 101 on the front surface 111 of the dielectric layer 110 are exposed from the solder mask layer 102 to form bonding fingers 103 where the bonding wires 130 are bonded. Terminals of the conductive trace 101 on the back surface 112 of the dielectric layer 110 form ball pads 104 where the solder balls 15 are implanted. With the bonding wires 130 bonded to the corresponding bonding fingers 103, electronic signals from the chip 120 can be transmitted through the bonding wires 130, the conductive traces 101 on the front surface 111 of the dielectric layer 110, and conductive vias 105 penetrating the dielectric layer 110, to the solder balls 15 on the back surface 112 of the dielectric layer 110 and finally to an external device (such as PCB) bonded to the solder balls 15, such that the chip 120 is electrically connected to the external device via the ball grid array 150 comprising the plurality of solder balls 15. Further, the chip 120, bonding wires 130, bonding fingers 103, and a part of the surface of the solder mask layer 102 are encapsulated and protected by the encapsulation body 140.

Furthermore, the chip 120 is adhered via a conductive adhesive 160 such as silver adhesive to the chip mounting area 108 serving as the ground paddle, such that the chip 120 is grounded to a ground plane (not shown) in the dielectric layer (resin core) 110 of the substrate 100 through the conductive adhesive 160 and the chip mounting area (ground paddle) 108.

To comply with the requirements such as high performance, portability, light-weight and size compactness for consumer electronic devices, a chip scale package (CSP) such as thin and fine-pitch ball grid array (TFBGA) package, having a smaller substrate and more I/O (input/output) terminals than the PBGA package, has been developed as disclosed in U.S. Pat. No. 5,592,025. This compact CSP with a high-density circuit layout is shown in FIGS. 2 and 3, whose structure is similar to that of the PBGA package shown in FIG. 1, except that in the CSP, the surface area of the substrate 200 is decreased, and the number of conductive traces 201 for inputting/outputting signals to/from the chip 220 and the number of bonding fingers 203 and ball pads 204 formed at the terminals of the conductive traces 201 are increased. Further, due to the reduced surface area of the substrate 200, a part of the conductive traces 201 in the CSP must be arranged in the chip mounting area 280 and underneath the chip 220, and these conductive traces 201 are extended to expose their terminals from the chip mounting area 280 to thus form the bonding finger 203 for bonding the bonding wires 230. As a result, unlike the PBGA package, the chip mounting area of the CSP cannot entirely serve as the ground paddle, making the limited surface area of the substrate 200 be in good use. Therefore, as shown in FIGS. 2 and 3, the ground paddle 208 is reduced to a size that would not interfere with the conductive traces 201 disposed in the chip mounting area 280. A plurality of ground traces 218 are extended from the ground paddle 208 to outside the chip mounting area 280, and exposed terminals of the ground traces 218 serve as ground pads 219 to allow the chip 220 to be grounded to the ground paddle 208 via bonding wires (not shown) bonded to the ground pads 219. Moreover, the chip 220 in CSP is mounted on the chip mounting area 280 via an insulating adhesive 260, instead of the conductive adhesive 160 used in the PBGA package, so as to prevent short circuit between the chip 220 and the ground paddle 208 or between the adjacent conductive traces 201.

Moreover, in order to avoid signal delays due to uneven lengths of the conductive traces, an attempt is made to prepare all the conductive traces having the same length, and to dispose elongated portions of the conductive traces in the chip mounting area, such that similarly to the above, the conductive traces with the elongated portions are arranged underneath the semiconductor chip and extended out of the chip mounting area.

However, when the semiconductor package having the conductive traces extended out of the chip mounting area, has completed the packaging process and is subject to a high temperature environment for example in a reliability test or a reflow-soldering process during solder ball implantation, due to mismatch in coefficient of thermal expansion (CTE) between the chip and the substrate, the substrate and the chip mounted on the chip mounting area of the substrate would respectively generate different degrees of thermal expansion, resulting in thermal stress between the substrate and the chip. In this case, the peripheral area of the chip, especially the positions located the most far away from the center of the chip, encounter the greatest thermal stress. As a result, the conductive traces on the peripheral area of the chip may be cracked or broken for example the cracked or broken portions 209 shown in FIGS. 2 and 3, which thereby degrades the reliability and yield of the semiconductor package.

SUMMARY OF THE INVENTION

It is therefore a primary objective of the present invention to provide a conductive trace structure and a semiconductor package having the conductive trace structure, which can effectively prevent thermal stress from being concentrated on the peripheral area of a chip mounted in the semiconductor package under a high temperature environment, so as to protect conductive traces from cracks or breaks, thereby assuring the reliability of the semiconductor package and improving the yield of the semiconductor package.

In accordance with the foregoing and other objectives, the present invention proposes a conductive trace structure formed on a substrate of a semiconductor package. The conductive trace structure comprises a plurality of conductive traces disposed respectively in and surrounding a chip mounting area defined on a front surface of the substrate for mounting a semiconductor chip on the chip mounting area, wherein terminals of the conductive traces are provided with bonding fingers where bonding wires are bonded, and the conductive traces in the chip mounting area are extended to expose the bonding fingers on the terminals thereof out of the chip mounting area, and wherein widened portions are formed on the conductive traces in the chip mounting area and at positions across a periphery of the chip mounting area, the widened portions having an increased line width.

A semiconductor package having the above conductive trace structure comprises: a semiconductor chip; a substrate comprising an insulating dielectric layer having a front surface and a back surface with a chip mounting area defined on the front surface for accommodating the semiconductor chip, a plurality of conductive traces formed on the front surface and the back surface of the dielectric layer, and an insulating layer for covering the conductive traces and the dielectric layer and having a plurality of openings, wherein the conductive traces on the front surface of the dielectric layer are disposed respectively in and surrounding the chip mounting area, and terminals of the conductive traces are provided with bonding fingers exposed via the openings of the insulating layer, and wherein the conductive traces in the chip mounting area are extended to expose the bonding fingers on the terminals thereof out of the chip mounting area, and widened portions are formed on the conductive traces in the chip mounting area and at positions across a periphery of the chip mounting area, the widened portions having an increased line width; a plurality of bonding wires for electrically connecting the semiconductor chip to the bonding fingers on the substrate; an encapsulation body for encapsulating the semiconductor chip, the bonding wires, the bonding fingers, and a part of the insulating layer; and a plurality of conductive elements implanted on the back surface of the substrate.

The widened portions of the conductive traces at the positions across the periphery of the chip mounting area on the substrate are increased in line width to enhance the structural strength of the widened portions. As a result, in a high temperature environment, the widened portions can sustain the concentrated thermal stress from the peripheral area of the chip caused by mismatch in CTE between the chip and the substrate. This thus prevents the conductive traces that pass through the periphery of the chip mounting area from cracks or breaks due to the thermal stress, such that the reliability and yield of the semiconductor package having the compact size and densely arranged conductive traces can be improved.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Preferred embodiments of a conductive trace structure and a semiconductor package having the conductive trace structure proposed in the present invention are described in detail as follows with reference to FIGS. 4 and 5. For the sake of simplicity, the drawings illustrate merely the elements and parts related to the embodiments of the present invention. It should be understood that the semiconductor package according to the present invention is more complex in the number of elements, the size and the entire layout in practice.

Figure 1:
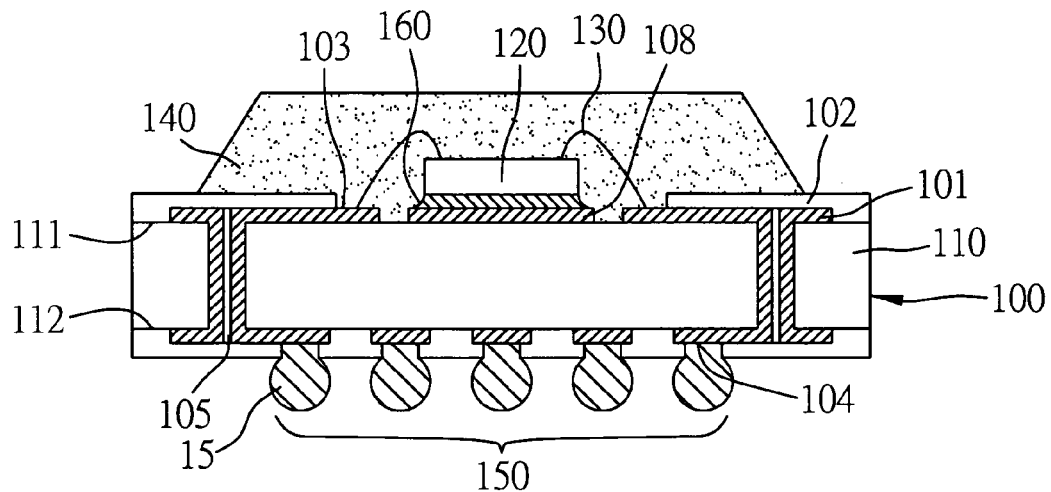
FIG. 1 (PRIOR ART) is a schematic cross-sectional diagram of a conventional plastic ball grid array (PBGA) semiconductor package.
Figure 2:
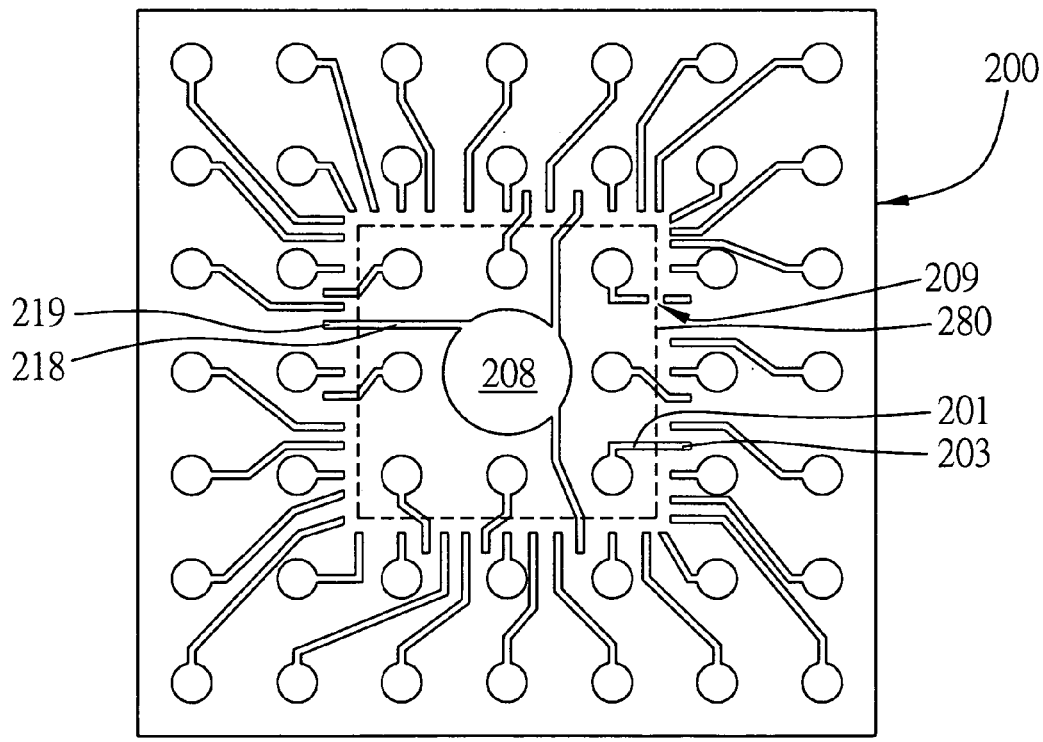
FIG. 2 (PRIOR ART) is a schematic top view of a layout of conductive traces and ground traces in a conventional chip scale package (CSP)
Figure 3:
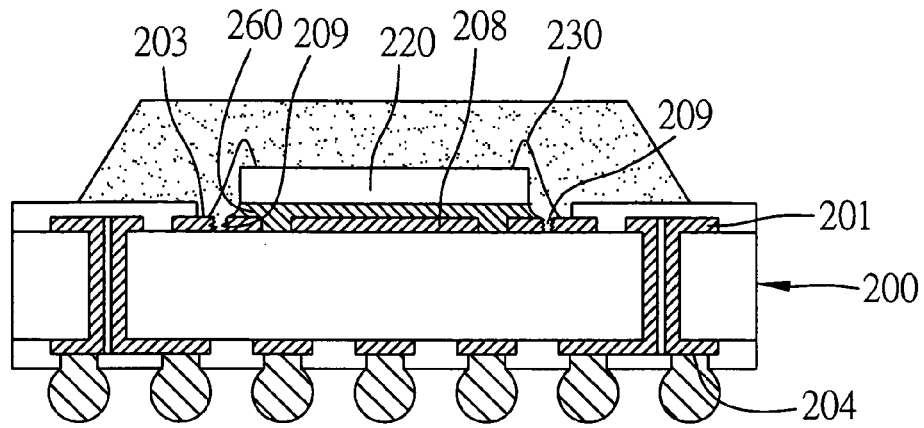
FIG. 3 (PRIOR ART) is a schematic cross-sectional diagram of a conventional chip scale package (CSP)
Figure 4:
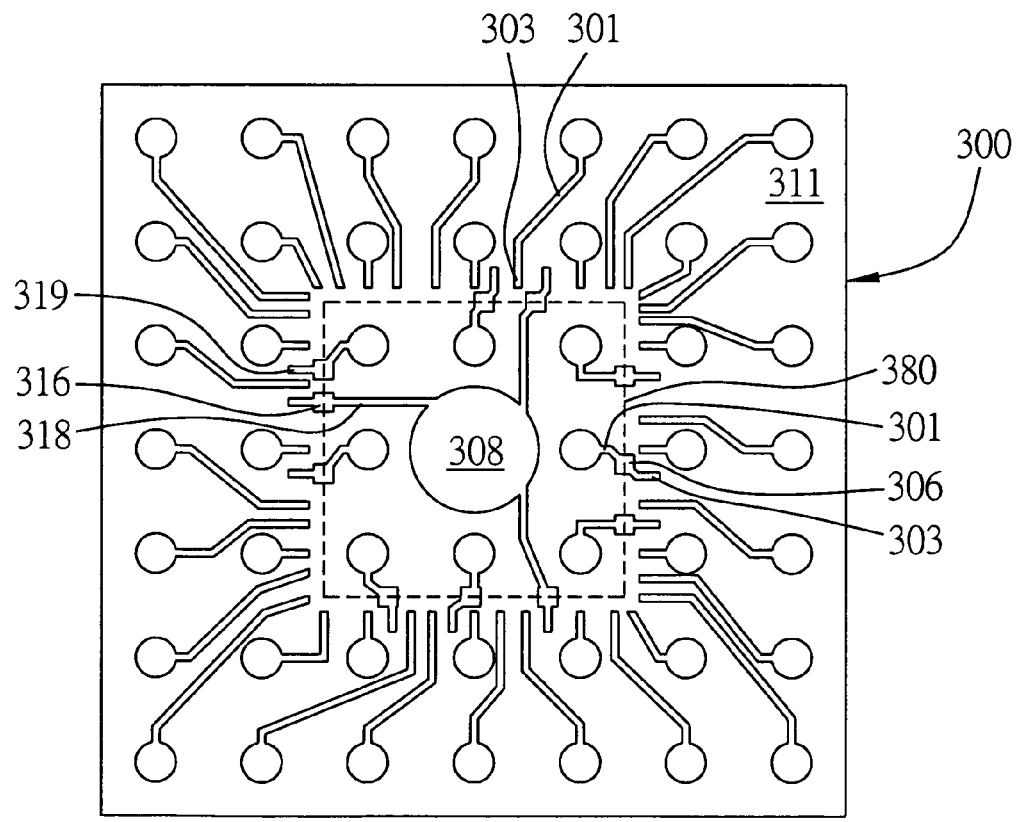
FIG. 4 is a schematic top view of a layout of conductive traces and ground traces for a conductive trace structure according to the present invention.
Figure 5:
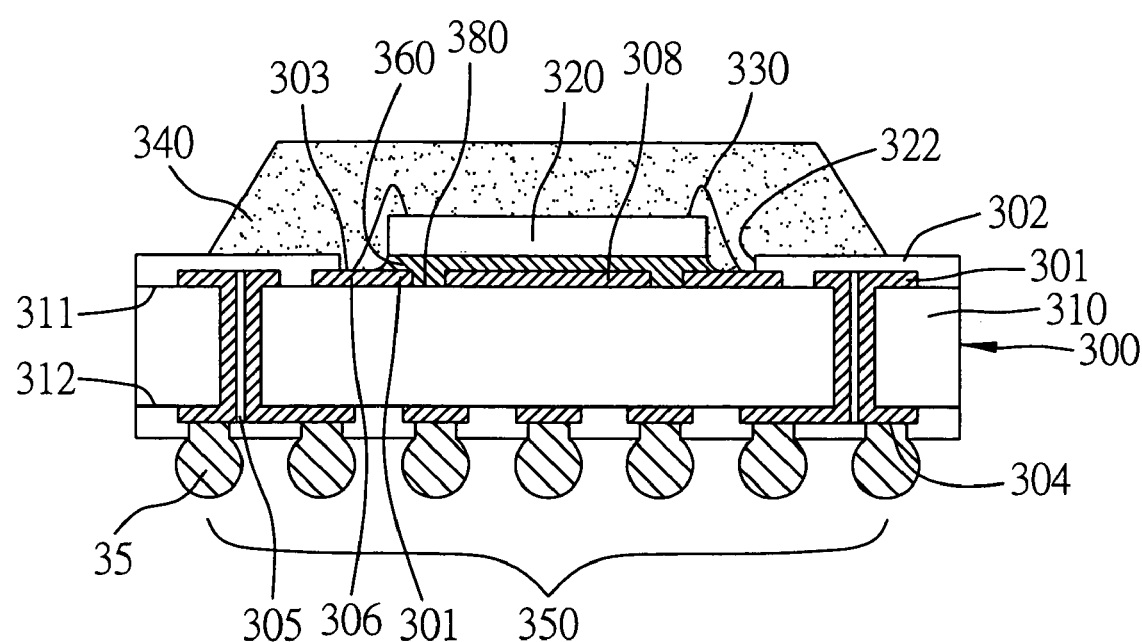
FIG. 5 is a schematic cross-sectional diagram of a semiconductor package according to the present invention.

Referring to FIGS. 4 and 5, the semiconductor package having the conductive trace structure according to the present invention comprises a substrate 300, a semiconductor chip 320 mounted on a front surface 311 of the substrate 300, a plurality of bonding wires 330 such as gold wires for electrically connecting the chip 320 to the substrate 300, an encapsulation body 340 for encapsulating the chip 320, the bonding wires 330 and a part of the substrate 300, and a plurality of conductive elements such as array-arranged solder balls 35 implanted on a back surface 312 of the substrate 300.

The substrate 300 comprises an insulating dielectric layer 310 having a chip mounting area 380 formed on the front surface 311 thereof for accommodating the chip 320; a plurality of conductive traces 301 disposed on the front surface 311 and the back surface 312 of the dielectric layer 310; and an insulating layer 302 such as solder mask for covering the conductive traces 301 and a plurality of openings 322 through the insulating layer 302. The plurality of conductive traces 301 on the front surface 311 of the dielectric layer 310 are distributed respectively in and surrounding the chip mounting area 380, constituting the proposed conductive trace structure. Terminals of the conductive traces 301 are exposed via the openings 322 of the insulating layer 302 to form bonding fingers 303 where the bonding wire 330 are bonded, wherein the conductive traces 301 distributed in the chip mounting area 380 are extended out of the chip mounting area 380 to expose the bonding fingers 303 thereof from the chip mounting area 380 to allow the bonding wires 330 to be bonded to the exposed bonding fingers 303.

A ground paddle 308 for grounding the chip 320 may be form in the chip mounting area 380 at a position (for example the center of the chip mounting area 380 as shown in FIG. 4) not interfering with the conductive traces 301 distributed in the chip mounting area 380. In this case, a plurality of ground traces 318 are extended from the ground paddle 308 to outside the chip mounting area 380, and exposed terminals of the ground traces 318 are adapted to form ground pads 319 to allow the chip 320 to be grounded to the ground paddle 308 via bonding wires (not shown) connected to the ground pads 319. It is alternative to locate the ground paddle 308 in or outside the chip mounting area 380 to fit practical design requirements. It should also be understood that the layout of the conductive traces 301 and the ground traces 318 may be arranged in a manner as shown in the drawing or according to the practical design requirements.

In particular, the conductive traces 301 and/or the ground traces 318 distributed in the chip mounting area 380 are formed with widened portions 306 and/or 316 having increased line width located at and across a periphery of the chip mounting area 380. For example, the line width of the widened portions 306 and/or 316 is increased to 1 to 3 times more than the line width of the rest part of the conductive traces 301 and/or the ground traces 318, so as to strengthen the structure of the widened portions 306 and/or 316. Preferably the width increase factor is 1 for the widened portions 306 and/or 316 to optimize the trace layout density.

The shape of the widened portions 306 and/or 316 can be rectangular as shown in the drawing, elliptic or any other shape to fit practical design requirements.

The insulating dielectric layer 310 of the substrate 300 can be made of an electrically insulating material such as BT (bismaleimide triazine) resin, polyimide resin, FR-4 resin, FR-5 resin, and so on.

The bonding wires 330 are bonded to the chip 320 and the bonding fingers 303 on the front surface 311 of the substrate 300 so as to electrically connect the chip 320 to the substrate 300. Terminals of the conductive traces 301 on the back surface 312 of the substrate 300 are adapted to form ball pads 304 where the solder balls 35 are implanted. This allows electronic signals from the chip 320 to be transmitted through the bonding wires 330, the conductive traces 301 on the front face 311 of the substrate 300, and conductive vias 305 penetrating the substrate 300, to the solder ball 35 mounted on the ball pads 304 and finally to an external device such as printed circuit board (PCB), making the chip 320 electrically connected to the external device via the ball grid array through a ball grid array 350 comprising the plurality of array-arranged solder balls 35.

The chip 320 is mounted on the chip mounting area 380 of the substrate 300 via an insulating adhesive 360 to prevent short circuit between the chip 320 and the ground paddle 308 or between the adjacent conductive traces 301.

It is a characteristic feature that, as described above, the widened portions 306 and/or 316 having increased line width located at and across the periphery of the chip mounting area 380 are formed on the conductive traces 301 and/or the ground traces 318 distributed in the chip mounting area 380. The line width of the widened portions 306 and/or 316 can be increased to 1 to 3 times more, preferably 1 time more, than the line width of the rest part of the conductive traces 301 and/or the ground traces 318, so as to enhance the structural strength of the widened portions 306 and/or 316. As a result, in a high temperature environment such as reliability test or a reflow-soldering process for solder ball implantation, the widened portions 306 and/or 316 can sustain the concentrated thermal stress from the peripheral area of the chip 320 caused by mismatch in CTE between the chip 320 and the substrate 300. This thus prevents the conductive traces 301 and the ground traces 318 that pass through the periphery of the chip mounting area 380 from cracks or breaks due to the thermal stress, such that the reliability and yield of the semiconductor package having the compact size and densely arranged conductive traces can be improved.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A conductive trace structure formed on a substrate of a semiconductor package, comprising a plurality of conductive traces disposed respectively in and surrounding a chip mounting area defined on a front surface of the substrate for mounting a semiconductor chip on the chip mounting area, wherein terminals of the conductive traces are provided with bonding fingers where bonding wires are bonded, and the conductive traces in the chip mounting area are extended to expose the bonding fingers on the terminals thereof out of the chip mounting area, and wherein widened portions are formed on the conductive traces in the chip mounting area and at positions across a periphery of the chip mounting area, the widened portions having an increased line width.

2. The conductive trace structure of claim 1, wherein the increased line width of the widened portions is larger than a line width of the rest part of the conductive traces.

3. The conductive trace structure of claim 2, wherein the line width of the widened portions is increased to 1 to 3 times more than the line width of the rest part of the conductive traces.

4. The conductive trace structure of claim 1, wherein a ground paddle for grounding the semiconductor chip is disposed in the chip mounting area at a position free of interference with the conductive traces in the chip mounting area, and a plurality of ground traces are extended from the ground paddle to outside the chip mounting area, so as to allow the chip to be grounded to the ground paddle via the ground traces.

5. The conductive trace structure of claim 4, wherein widened portions are formed on the ground traces and at positions across the periphery of the chip mounting area, and a line width of the widened portions is increased to 1 to 3 times more than a line width of the rest part of the ground traces.

6. A semiconductor package, comprising:
a semiconductor chip;
a substrate comprising an insulating dielectric layer having a front surface and a back surface with a chip mounting area defined on the front surface for accommodating the semiconductor chip, a plurality of conductive traces formed on the front surface and the back surface of the dielectric layer, and an insulating layer for covering the conductive traces and the dielectric layer and having a plurality of openings, wherein the conductive traces on the front surface of the dielectric layer are disposed respectively in and surrounding the chip mounting area, and terminals of the conductive traces are provided with bonding fingers exposed via the openings of the insulating layer, and wherein the conductive traces in the chip mounting area are extended to expose the bonding fingers on the terminals thereof out of the chip mounting area, and widened portions are formed on the conductive traces in the chip mounting area and at positions across a periphery of the chip mounting area, the widened portions having an increased line width;

a plurality of bonding wires for electrically connecting the semiconductor chip to the bonding fingers on the substrate;

an encapsulation body for encapsulating the semiconductor chip, the bonding wires, the bonding fingers, and a part of the insulating layer; and a plurality of conductive elements implanted on the back surface of the substrate.

7. The semiconductor package of claim 6, wherein the insulating dielectric layer is made of an insulating material selected from the group consisting of BT (bismaleimide triazine) resin, polyimide resin, FR-4 resin, and FR-5 resin.

8. The semiconductor package of claim 6, wherein the insulating layer is a solder mask layer.

9. The semiconductor package of claim 6, wherein the increased line width of the widened portions is larger than a line width of the rest part of the conductive traces.

10. The semiconductor package of claim 9, wherein the line width of the widened portions is increased to 1 to 3 times more than the line width of the rest part of the conductive traces.

11. The semiconductor package of claim 6, wherein the conductive elements are solder balls.

12. The semiconductor package of claim 6, wherein the bonding wires are gold wires.

13. The semiconductor package of claim 6, wherein a ground paddle for grounding the semiconductor chip is disposed in the chip mounting area at a position free of interference with the conductive traces in the chip mounting area, and a plurality of ground traces are extended from the ground paddle to outside the chip mounting area, so as to allow the chip to be grounded to the ground paddle via the ground traces.

14. The semiconductor package of claim 13, wherein widened portions are formed on the ground traces and at positions across the periphery of the chip mounting area, and a line width of the widened portions is increased to 1 to 3 times more than a line width of the rest part of the ground traces.

* * * * *